US010464807B2

(12) United States Patent
Barzen et al.

(10) Patent No.: US 10,464,807 B2
(45) Date of Patent: Nov. 5, 2019

(54) SEMICONDUCTOR DEVICE, MICROPHONE AND METHOD FOR PRODUCING A SEMICONDUCTOR DEVICE

(71) Applicant: Infineon Technologies AG, Neubiberg (DE)

(72) Inventors: Stefan Barzen, Munich (DE); Wolfgang Friza, Villach (AT); Marc Fueldner, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 15/813,990

(22) Filed: Nov. 15, 2017

(65) Prior Publication Data

US 2018/0170745 A1 Jun. 21, 2018

(30) Foreign Application Priority Data

Dec. 21, 2016 (DE) ........................ 10 2016 125 082

(51) Int. Cl.
*B81B 3/00* (2006.01)
*H04R 9/08* (2006.01)
(Continued)

(52) U.S. Cl.
CPC .......... *B81B 3/007* (2013.01); *B81C 1/00619* (2013.01); *H04R 9/08* (2013.01); *H04R 31/00* (2013.01); *H04R 31/003* (2013.01); *B81B 2201/0235* (2013.01); *B81B 2201/0257* (2013.01); *B81B 2201/0264* (2013.01); (Continued)

(58) Field of Classification Search
CPC .. B81B 3/007; B81B 3/00; B81B 7/02; B81B 2201/0235; B81B 2201/0264; B81B 2201/0257; B81B 2203/0361; B81B 2203/04; B81B 2203/0315; B81B 2203/0127; H04R 31/003; H04R 31/00; H04R 9/08; H04R 19/005; H04R 17/02; H04R 2201/003; B81C 1/00; B81C 1/00619; B81C 2201/0109; B81C 2201/0133; B81C 2201/0132
See application file for complete search history.

(56) References Cited

U.S. PATENT DOCUMENTS 7,346,178 B2 *  3/2008  Zhe ..................... H04R 31/003
                                                381/174
8,436,435 B2 *  5/2013  Chan .................... H04R 19/005
                                                257/416
(Continued)

FOREIGN PATENT DOCUMENTS

DE   102005008514 A1   8/2006
DE   102012216150 A1   3/2013

*Primary Examiner* — Oyesola C Ojo
(74) *Attorney, Agent, or Firm* — Shumaker & Sieffert, P.A.

(57) ABSTRACT

A semiconductor device is proposed. The semiconductor device comprises a membrane structure having an opening. Furthermore, the semiconductor device comprises a first backplate structure, which is arranged on a first side of the membrane structure, and a second backplate structure, which is arranged on a second side of the membrane structure. The semiconductor device furthermore comprises a vertical connection structure, which connects the first backplate structure to the second backplate structure. In this case, the vertical connection structure extends through the opening.

20 Claims, 7 Drawing Sheets

(51) Int. Cl.
  *H04R 31/00* (2006.01)
  *B81C 1/00* (2006.01)
  *H04R 17/02* (2006.01)
  *H04R 19/00* (2006.01)

(52) U.S. Cl.
  CPC ............. *B81B 2203/0127* (2013.01); *B81B 2203/0315* (2013.01); *B81B 2203/0361* (2013.01); *B81B 2203/04* (2013.01); *B81C 2201/0109* (2013.01); *B81C 2201/0132* (2013.01); *B81C 2201/0133* (2013.01); *H04R 17/02* (2013.01); *H04R 19/005* (2013.01); *H04R 2201/003* (2013.01)

(56) References Cited

U.S. PATENT DOCUMENTS

| | | | | |
|---|---|---|---|---|
| 8,600,083 | B2* | 12/2013 | Chiang | H04R 19/013 381/174 |
| 8,644,528 | B2* | 2/2014 | Mehregany | H04R 19/005 381/174 |
| 9,148,726 | B2* | 9/2015 | Dehe | G01L 9/0016 |
| 9,219,963 | B2* | 12/2015 | Yang | H04R 19/005 |
| 9,369,808 | B2* | 6/2016 | Chen | H04R 19/005 |
| 2006/0093171 | A1* | 5/2006 | Zhe | H04R 31/003 381/191 |
| 2006/0150739 | A1* | 7/2006 | Yasuda | G01H 11/06 73/654 |
| 2007/0232107 | A1* | 10/2007 | Sugiura | B81C 1/00269 439/226 |
| 2009/0014819 | A1* | 1/2009 | Loeffler | B81B 3/0072 257/415 |
| 2009/0129611 | A1* | 5/2009 | Leidl | H04R 17/02 381/173 |
| 2010/0002543 | A1* | 1/2010 | Schlosser | H04R 19/005 367/181 |
| 2011/0075865 | A1* | 3/2011 | Yang | H04R 19/005 381/174 |
| 2013/0010995 | A1* | 1/2013 | Kim | H04R 19/016 381/355 |
| 2014/0210020 | A1 | 7/2014 | Dehe | |
| 2014/0270271 | A1* | 9/2014 | Dehe | B81B 3/0018 381/174 |
| 2015/0078592 | A1* | 3/2015 | Uchida | H04R 19/04 381/191 |
| 2015/0110302 | A1* | 4/2015 | Chen | H04R 19/005 381/162 |
| 2015/0129992 | A1* | 5/2015 | Hur | H04R 19/04 257/416 |
| 2015/0146906 | A1* | 5/2015 | Je | H04R 7/02 381/369 |
| 2016/0340173 | A1* | 11/2016 | Klein | B81B 3/007 |
| 2017/0210612 | A1* | 7/2017 | Chen | B81B 3/001 |
| 2017/0230757 | A1* | 8/2017 | Kuntzman | H04R 19/04 |
| 2018/0091906 | A1* | 3/2018 | Khenkin | H04R 19/04 |
| 2018/0146296 | A1* | 5/2018 | Meisel | H04R 9/08 |

* cited by examiner

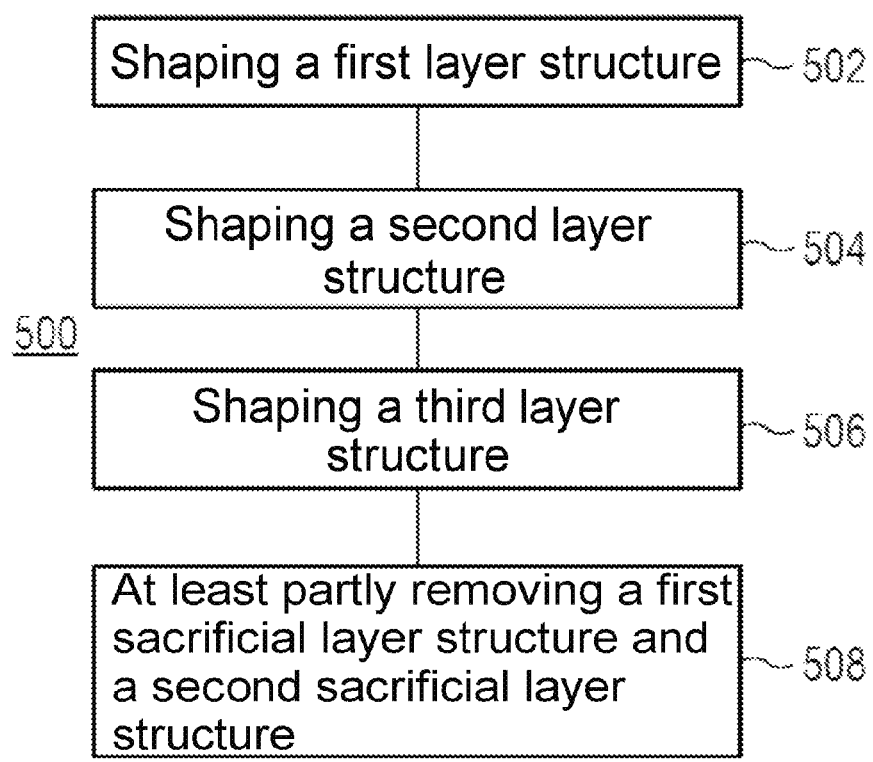

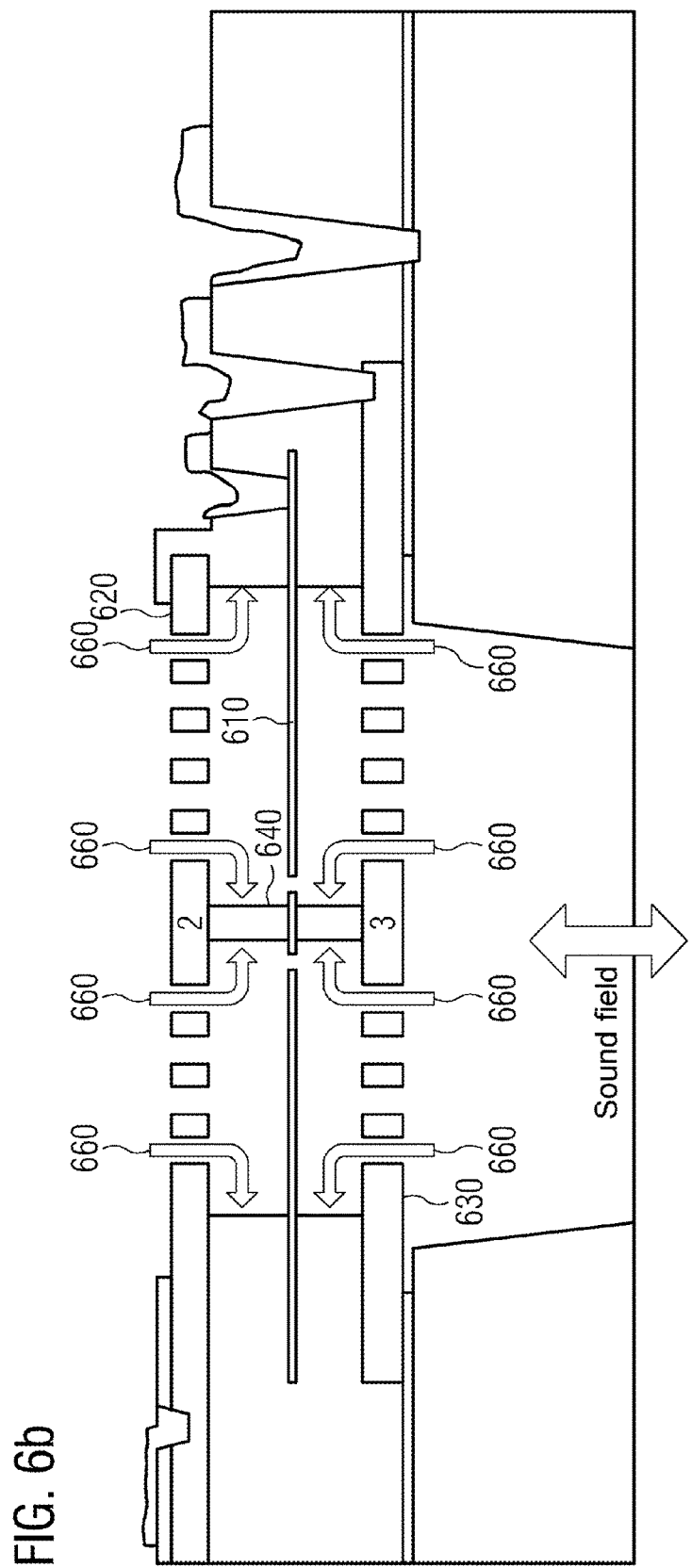

SEMICONDUCTOR DEVICE, MICROPHONE AND METHOD FOR PRODUCING A SEMICONDUCTOR DEVICE

TECHNICAL FIELD

Exemplary embodiments are concerned with a semiconductor device, a microphone and a method for producing a semiconductor device.

BACKGROUND

Capacitive semiconductor microphones may comprise, besides a membrane, two backplates separated by an air gap. The backplates should be as thin as possible and have large openings in order to achieve a high acoustic transparency. Flexure of the backplates is likewise intended to be avoided.

SUMMARY

There is a need to provide a concept for semiconductor devices comprising a membrane which makes it possible to improve the robustness of the semiconductor device, to improve the flexibility of the movement of the membrane and/or to improve the accuracy of detecting the movement of the membrane.

The need can be met by the subject matter of the patent claims.

Exemplary embodiments of a semiconductor device comprise a membrane structure having an opening. Furthermore, the semiconductor device comprises a first backplate structure, which is arranged on a first side of the membrane structure, and a second backplate structure, which is arranged on a second side of the membrane structure. The semiconductor device furthermore comprises a vertical connection structure, which connects the first backplate structure to the second backplate structure. In this case, the vertical connection structure extends through the opening.

Further exemplary embodiments relate to a microphone comprising the above semiconductor device.

In addition, exemplary embodiments relate to a method for producing a semiconductor device. The method comprises shaping a first layer structure for producing a first backplate structure. Furthermore, the method comprises shaping a second layer structure for producing a membrane structure having an opening. Moreover, the method comprises shaping a third layer structure for producing a second backplate structure. The method furthermore comprises removing at least one part of a first sacrificial layer structure between the first backplate structure and the membrane structure and at least one part of a second sacrificial layer structure between the second backplate structure and the membrane structure, such that a vertical connection structure remains which connects the first backplate structure to the second backplate structure and extends through the opening of the membrane structure.

BRIEF DESCRIPTION OF THE FIGURES

Exemplary embodiments are explained in greater detail below with reference to the accompanying figures, in which:

FIG. 5 shows a flow diagram of one exemplary embodiment of a method for producing a semiconductor device; and FIGS. 6a and 6b show a semiconductor structure in different method steps of a method for producing a semiconductor device.

DESCRIPTION

Figure 1:
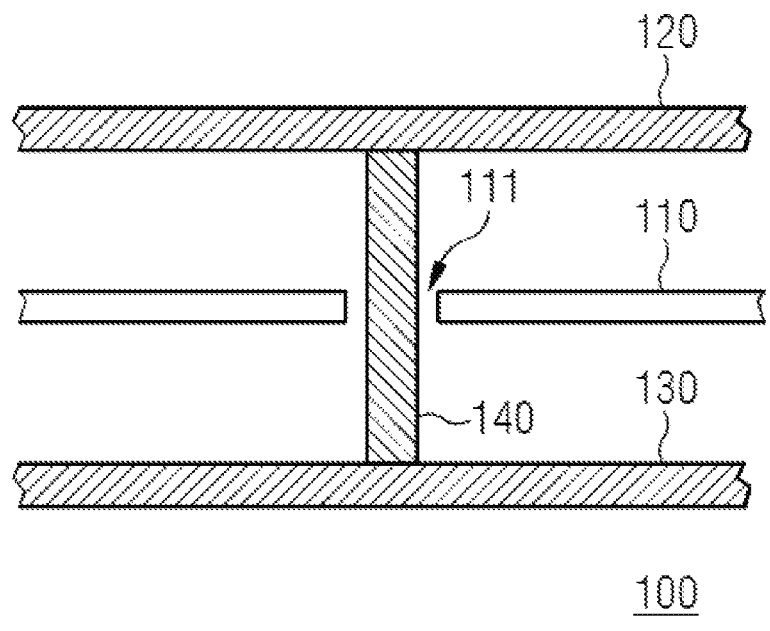
FIG. 1 shows one exemplary embodiment of a semiconductor device.

Various exemplary embodiments will now be described more thoroughly with reference to the accompanying drawings illustrating some exemplary embodiments. In figures, the thickness dimensions of lines, layers and/or regions may be illustrated in an exaggerated manner for the sake of clarity.

In the following description of the accompanying figures, which show only a few exemplary embodiments by way of example, identical reference signs may designate identical or comparable components. Furthermore, summarizing reference signs may be used for components and objects which occur multiply in an exemplary embodiment or in a drawing but are described jointly with regard to one or more features. Components or objects which are described with identical or summarizing reference signs may be embodied identically, but if appropriate also differently, with regard to individual, a plurality of or all of the features, for example their dimensionings, provided that the description does not explicitly or implicitly reveal something to the contrary.

Although exemplary embodiments may be modified and altered in various ways, exemplary embodiments in the figures are illustrated as examples and are described thoroughly herein. It should be clarified, however, that the intention is not to restrict exemplary embodiments to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element which is designated as "connected" or "coupled" to another element may be directly connected or coupled to the other element or intervening elements may be present.

The terminology used herein serves only to describe specific exemplary embodiments, and it is not intended to restrict the exemplary embodiments. As used herein, the singular forms "a", "an" and "the" are also intended to include the plural forms as long as the context does not unambiguously indicate something to the contrary. Furthermore, it should be clarified that the expressions such as e.g. "includes", "including", "comprises" and/or "comprising", as used herein, indicate the presence of stated features, whole numbers, steps, work sequences, elements and/or components, but do not exclude the presence or the addition of one or more features, whole numbers, steps, work sequences, elements, components and/or groups thereof.

Unless defined otherwise, all terms used herein (including technical and scientific terms) have the same meaning ascribed to them by a person of average skill in the art in the field to which the exemplary embodiments belong. Furthermore, it should be clarified that expressions, e.g. those defined in dictionaries generally used, should be interpreted as if they had the meaning which is consistent with their meaning in the context of the relevant art, as long as this is not expressly defined differently herein.

FIG. 1 shows a semiconductor device 100. The semiconductor device 100 comprises a membrane structure 110 having an opening 111. Furthermore, the semiconductor device 100 comprises a first backplate structure 120, which is arranged on a first side of the membrane structure 110, and a second backplate structure 130, which is arranged on a second side of the membrane structure 110. The semiconductor device 100 furthermore comprises a vertical connection structure 140, which connects the first backplate structure 120 to the second backplate structure 130. In this case, the vertical connection structure 140 extends through the opening 111.

The vertical connection structure 140 enables a mechanical connection of the first and second backplate structures 120, 130. As a result, a dimensional stability of the two backplate structures 120 and 130 can be increased. Flexure of the two backplate structures 120 and 130 can be reduced. This can make it possible to improve the robustness of the semiconductor device 100. An improvement in the flexibility of the movement of the membrane structure 110 can likewise be made possible. The accuracy of detecting the movement of the membrane structure 110 can also be improved.

The membrane structure 110, the first backplate structure 120 and also the second backplate structure 130 can be formed from one or more layers. At least one layer of the membrane structure 110, of the first backplate structure 120 or of the second backplate structure 130 can be an electrically conductive layer, such as e.g. a metal layer (e.g. Al, Ti, Cu) or a polysilicon (e.g. highly doped).

The opening 111 can be formed by a structuring of one or more layer structures of the membrane structure. By way of example, a portion of the layer structures of the membrane structure can remain in the opening (see below). Alternatively, any (all) layer structures of the membrane structure can be removed in the opening 111 and a part of the vertical connection structure 140 can subsequently be produced in the opening 111 (see below).

As indicated in FIG. 1, the membrane structure 110 can be arranged in a cavity between the first backplate structure 120 and the second backplate structure 130. A sufficient space for the deflection of the membrane structure 110 can be provided as a result. The cavity between the first backplate structure 120 and the second backplate structure 130 can have e.g. a vertical extension (height) of greater than 1 µm (or greater than 2 µm or greater than 5 µm) and/or less than 20 µm (or less than 10 µm or less than 5 µm). By way of example, a vertical distance between the first backplate structure 120 and the second backplate structure 130 can be greater than 1 µm (or greater than 2 µm or greater than 5 µm) and/or less than 20 µm (or less than 10 µm or less than 5 µm). A lateral extension of the cavity between the first backplate structure 120 and the second backplate structure 130 can be for example greater than 10 µm (or greater than 100 µm or greater than 1000 µm) and/or less than 2000 µm (or less than 200 µm or less than 50 µm). A vertical extension of the first backplate structure 120 and of the second backplate structure 130 can be for example greater than 10 µm (or greater than 100 µm or greater than 250 µm) and/or less than 500 µm (or less than 200 µm or less than 50 µm).

The lateral dimensions (lateral extension) of the membrane structure 110 can substantially correspond to the lateral extension of the first backplate structure 120 or of the second backplate structure 130. In this regard, the lateral dimensions of the membrane structure 110 can deviate from the lateral extension of the first backplate structure 120 or of the second backplate structure 130 e.g. by less than 10%.

The membrane structure 110 can have e.g. a vertical extension (thickness) of greater than 100 nm (or greater than 500 nm or greater than 1 µm) and/or less than 2 µm (or less than 750 nm or less than 200 nm).

The vertical connection structure 140 can comprise for example a second partial region arranged vertically between a first partial region and a third partial region. A material of the second partial region is different than a material of the first partial region and of the third partial region. The material of the first partial region and of the third partial region can be for example an electrically insulating material (e.g. a silicon oxide or silicon nitride). In this way, it is possible to avoid an electrical coupling of the first backplate structure 120 and the second backplate structure 130 through the vertical connection structure 140.

The second partial region of the vertical connection structure 140 can consist of the same material as the membrane structure 110. By way of example, a partial region of a layer structure, which partial region lies in the opening of the membrane structure 110 and is used for producing the membrane structure 110, can serve as the second partial region. Correspondingly, a lateral distance between the vertical connection structure 140 (e.g. substantially a distance between the second partial region of the vertical connection structure 140) and the membrane structure 110 can be produced with great accuracy as a result of the structuring of the layer structure.

The vertical connection structure 140 can extend through the opening 111 in a manner free of contact. By way of example, it is possible for the membrane structure 110 not to be mechanically connected to the vertical connection structure 140. As a result, a limitation or influencing of a movement of the membrane structure 110 can be substantially avoided.

By way of example, the vertical connection structure 140 and the membrane structure 110 can be spaced apart from one another by at least 100 nm laterally in a region of the opening 111. The vertical connection structure 140 and the membrane structure 110 can be spaced apart by e.g. more than 500 nm (or more than 2 µm or more than 5 µm) and/or less than 10 µm (or less than 2 µm or less than 500 nm) laterally in the region of the opening 111.

A lateral extension of the vertical connection structure 140 can be more than 200 nm (or more than 2 µm or more than 50 µm), and/or less than 100 µm (or less than 20 µm or less than 500 nm). The vertical connection structure 140 can also be embodied in an acicular fashion. The vertical extension of the vertical connection structure 140 can be for example a multiple of the lateral extension of the vertical connection structure 140 (e.g. more than twice, more than four times or more than ten times said lateral extension). The vertical connection structure 140 can thus e.g. have a length significantly greater than its width.

The circumference of the lateral connection structure 140 vertically can be substantially constant or else vary. By way of example, an average circumference of the lateral connection structure 140 in a region between the first backplate structure 120 and the membrane structure 110 can differ from an average circumference of the lateral connection structure 140 in a region between the membrane structure 110 and the second backplate structure 130 by at least 10% (e.g. more than 15% or more than 25% and/or less than 50% or less than 20%). A width of the lateral connection structure 140 between the first backplate structure 120 and the membrane structure 110 can be e.g. different than a width of the lateral connection structure 140 between the membrane structure 110 and the second backplate structure 130.

By way of example, a minimal lateral extension (extent) of the lateral connection structure 140 can be less than 80% (e.g. less than 60% and/or more than 25%) of a maximum lateral extension (extent) of the lateral connection structure 140 in the region of the opening 111. By way of example, the lateral connection structure 140 can have its largest lateral extent in the region of the opening 111.

The lateral connection structure 140 can be arranged for example in a central region of the membrane structure 110. In this regard, e.g. a lateral distance between the vertical connection structure 140 and a (laterally outer) edge of the membrane structure 110 can be at least 25% (e.g. more than 35% and/or less than 50%) of a (maximum) lateral extension of the membrane structure 110. By way of example, a lateral distance between the vertical connection structure 140 and a lateral boundary of the cavity between the first backplate structure 120 and the second backplate structure 130 can be at least 25% of a (maximum) lateral extension of the cavity.

Correspondingly, the opening 111 can also be arranged in a central region of the membrane structure 110. In this regard, e.g. a lateral distance between the opening 111 and a (laterally outer) edge of the membrane structure 110 can be at least 20% (e.g. more than 25% and/or less than 45%) of a (maximum) lateral extension of the membrane structure 110. A lateral distance between the opening 111 and an edge of the membrane structure 110 can be e.g. at least 5 μm (e.g. more than 50 μm or more than 500 μm and/or less than 2000 μm or less than 500 μm).

At least one of the first backplate structure 120 and the second backplate structure 130 can have a plurality of passages (openings). In this regard, the first backplate structure 120 and/or the second backplate structure 130 can have a plurality of passages in order to enable an acoustic transparency of the first backplate structure 120 and/or of the second backplate structure 130. A lateral extension of a passage (opening) along the surface of the first backplate structure 120 and/or of the second backplate structure 130 can be e.g. greater than 200 nm (or greater than 2 μm or greater than 20 μm) and/or less than 100 μm (or less than 10 μm or less than 1 μm).

The plurality of passages can take up at least 60% (e.g. more than 70, more than 75% or more than 80%) of a surface area of at least one of the first backplate structure and the second backplate structure. By way of example, the passages can take up more than 70% or 80% of a surface area of the first backplate structure and/or of the second backplate structure. The increased dimensional stability of the two backplate structures 120, 130 on account of the vertical connection structure 140 can enable an increased coverage of the surface of the first backplate structure and/or the second backplate structure with passages and thus an increased acoustic transparency.

The semiconductor device 100 can furthermore comprise a (first) circuit configured to apply different electrical potentials to the membrane structure 110 and at least one of the first backplate structure 120 and the second backplate structure 130. The membrane structure 110, the first backplate structure 120 and/or the second backplate structure 130 can be at least partly electrically conductive for this purpose. In order to electrically couple the (first) circuit to the membrane structure 110, the first backplate structure 120 and/or the second backplate structure 130, the semiconductor device 100 can comprise one or more electrical contacts electrically connected to the first circuit and the membrane structure 110, the first backplate structure 120 and/or the second backplate structure 130. In this way, it is possible to generate an electric field between the membrane structure 110 and the first backplate structure 120 and/or the second backplate structure 130. The (first) circuit can be implemented for example on the same semiconductor substrate as the membrane structure 110.

In the event of a movement of the membrane structure 110 (in e.g. a sound field), the capacitance of the system changes. Given the presence of the electric field, it is therefore possible to generate electrical signals between the membrane structure 110 and the first backplate structure 120 and/or the second backplate structure 130. Therefore, the semiconductor device 100 can comprise one or more electrical contacts electrically coupled to the membrane structure 110, the first backplate structure 120 and/or the second backplate structure 130, in order to tap off the electrical signals. These electrical signals can be processed further in order to provide an output signal dependent on the movment of the membrane structure 110. To that end, the semiconductor device 100 can for example furthermore comprise a (second) circuit configured to generate a signal dependent on the distance between the membrane structure 110 and the first backplate structure 120 and/or the second backplate structure 130. The (second) circuit can generate said signal e.g. on the basis of the electrical signals tapped off. The (second) circuit can be implemented for example on the same semiconductor substrate as the membrane structure 110.

Besides the vertical connection structure 140, the semiconductor device 100 can comprise further vertical connection structures that connect the first backplate structure 120 to the second backplate structure 130. The semiconductor device 100 can comprise for example a plurality (e.g. more than 2, more than 10 or more than 100) of vertical connection structures that connect the first backplate structure 120 to the second backplate structure 130. Correspondingly, the membrane structure 110 can also have a plurality of openings through which the plurality of vertical connection structures extend. A dimensional stability of the two backplate structures 120 and 130 can be increased further as a result.

The membrane structure 110 may for example have no openings apart from those through which a vertical connection structure extends. By way of example, the membrane structure 110 may have exactly one opening for each vertical connection structure of the semiconductor device 100.

The semiconductor device 100 can comprise a semiconductor substrate, for example. The semiconductor substrate can be a silicon substrate. Alternatively, the semiconductor substrate can be a wide band-gap semiconductor substrate having a band gap greater than the band gap of silicon (1.1 eV). By way of example, the semiconductor substrate can be a semiconductor substrate based on silicon carbide (SiC) or a semiconductor substrate based on gallium arsenide (GaAs) or a semiconductor substrate based on gallium nitride (GaN). The semiconductor substrate can be a semiconductor wafer or a semiconductor chip. The membrane structure 110, the first backplate structure 120 and the second backplate structure 130 can be implemented in a layer stack on the semiconductor substrate. Alternatively, at least the second backplate structure 130 (as lower backplate structure) can be implemented by a part of the semiconductor substrate.

By way of example, the vertical direction and a vertical dimension or thicknesses of layers may be measured orthogonally with respect to a front-side surface of the semiconductor substrate of the semiconductor device 100 and a lateral direction and lateral dimensions may be measured parallel to the front-side surface of the semiconductor substrate of the semiconductor device 100.

The semiconductor device 100 may be for example a MEMS device (abbreviation of MicroElectroMechanical System, MEMS), in which the membrane structure 110 is embodied as a MEMS element. The semiconductor device 100 may be for example a microphone, a pressure sensor, an acceleration sensor or a part thereof.

Figure 2:
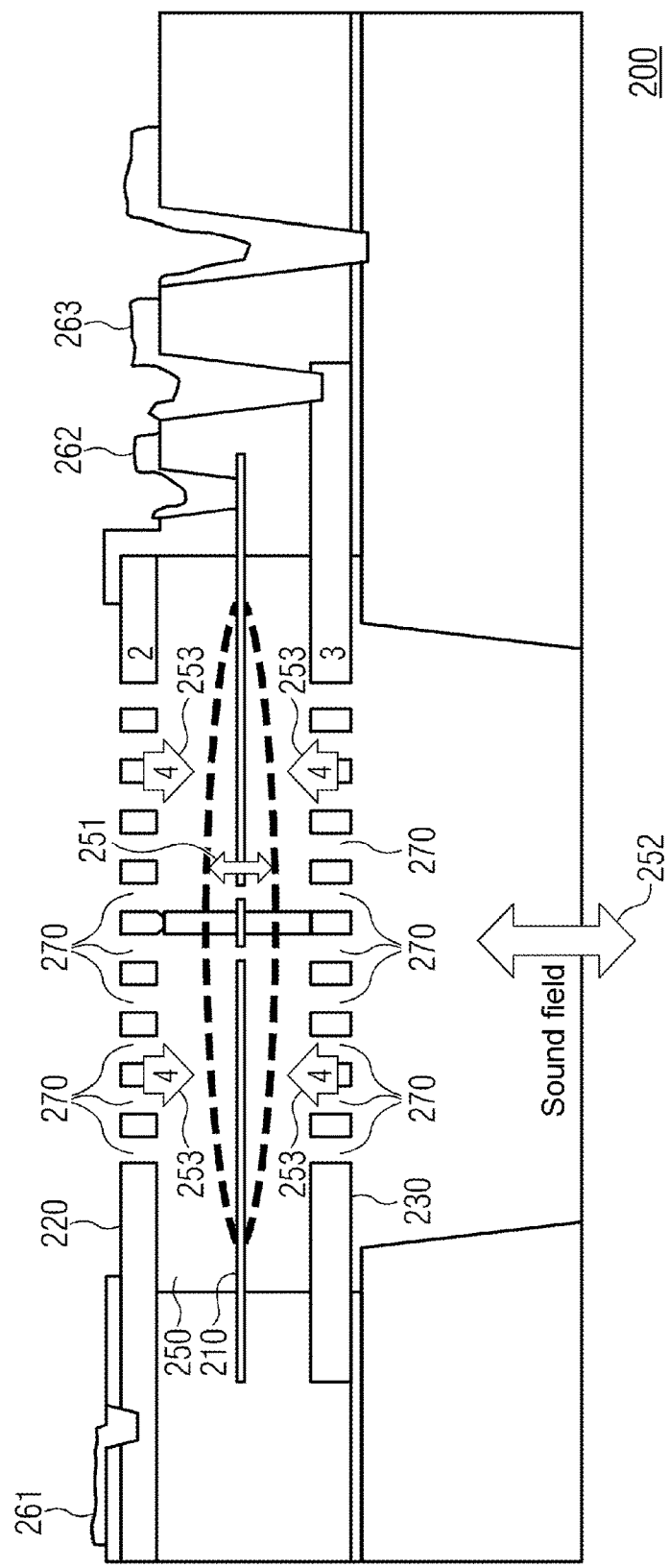
FIG. 2 shows one exemplary embodiment of a microphone.

The semiconductor device 100 may be e.g. part of a microphone. One exemplary embodiment of a microphone 200 comprising a semiconductor device in accordance with the proposed concept is shown in FIG. 2. The microphone 200 may be e.g. a capacitive silicon microphone.

The microphone 200 comprises a membrane structure (membrane) 210 having an opening 211. A first backplate structure (backplate) 220 is arranged on a first side of the membrane structure 210. A second backplate structure (backplate) 230 is arranged on a second side of the membrane structure. The membrane 210 and the two backplates 220, 230 are separated by an air gap 250.

The membrane 200 moves—as indicated by the arrow 251—in a sound field 252 received by the microphone 200. The membrane 210 and also the two backplates 220, 230 are at least partly electrically conductive. As the distance between the membrane 210 and the two backplates 220, 230 changes, the capacitance of the system changes. An electrical potential is respectively applied to the membrane 210 and to the two backplates 220, 230 via the electrical contacts 261, 262 and 263. On account of the resulting electric field between the membrane 210 and the backplates 220, 230, the changing capacitance generates an electrical signal in the membrane 210 and the backplates 220, 230. The variation of the electrical signal is proportional to the movement of the membrane 210 and thus to the sound field 252.

However, the presence of the backplates 220, 230 can make a considerable contribution to the noise of the system. In order to reduce the noise level, the backplates 220, 230 should be thin and designed and manufactured with large openings 270, in order to achieve a high acoustic transparency.

However, the attractive force of the applied voltage (electrical potential) pulls the backplates 220, 230 in the direction of the membrane 210—as indicated by the arrows 253 in FIG. 2. This can reduce the operating range of the membrane 210 and the voltage that can be applied and thus limit the resultant signal. In order to reduce this bending effect of the backplates 220, 230, the structure of the backplates 220, 230 requires a specific stiffness.

Said stiffness can be achieved by use of films having a particularly high loading capacity, thicker films and an adapted backplate design. However, this may limit the degree of acoustic transparency of the backplates 220, 230 and therefore the reduction of the noise contribution of the backplates 220, 230. The optimization of the signal-to-noise ratio (SNR) may be significantly restricted by these boundary conditions for microphones since it is necessary to make a compromise between the requirements of the high backplate transparency and a sufficient backplate stiffness. This compromise may sometimes limit the increase in the SNR of the MEMS.

By virtue of the fact that the microphone 200 comprises a vertical connection structure 240 that extends through the opening 211 and connects the first backplate 220 to the second backplate 230, the dimensional stability of the backplates 220, 230 can be (greatly) increased since the vertical connection structure 240 can compensate for the attractive force of the applied field and can reduce the movement of the backplates 220, 230 in the direction of the membrane 210. As shown in FIG. 2, it is possible to use one vertical connection structure or else a plurality of vertical connection structures (posts), that connect the first backplate and the second backplate to one another. A plurality of connection structures (posts) may be arranged homogeneously—that is to say e.g. in a hexagonal structure or radially symmetrically.

This can enable a significant increase in the acoustic transparency of the backplates 220, 230 and hence a reduction of the noise generated by the backplates. Since the backplate post 240 is not mechanically connected to the membrane 210, the movement of the membrane 210 cannot be significantly limited or influenced. Consequently, the signal level can remain virtually the same. The total SNR of the system can increase. A better system performance can be achieved thereby, or it is possible to obtain a reduction of the chip size (e.g. of the microphone) and thus a cost reduction with identical acoustic parameters.

Some exemplary embodiments may thus relate to a silicon microphone MEMS comprising a double backplate and backplate post.

Figure 3A:
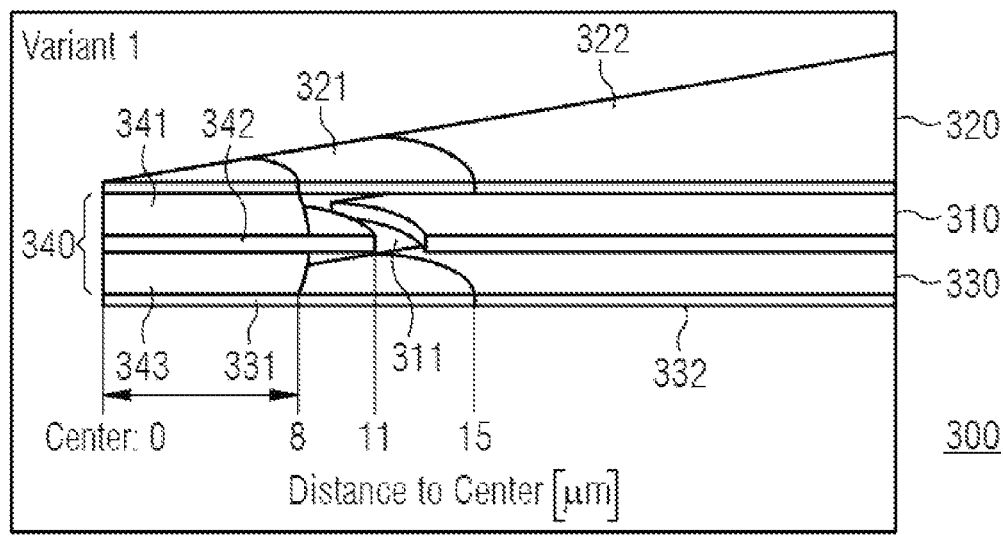
FIGS. 3a to 3c show various exemplary embodiments of a vertical connection structure.
Figure 3B:
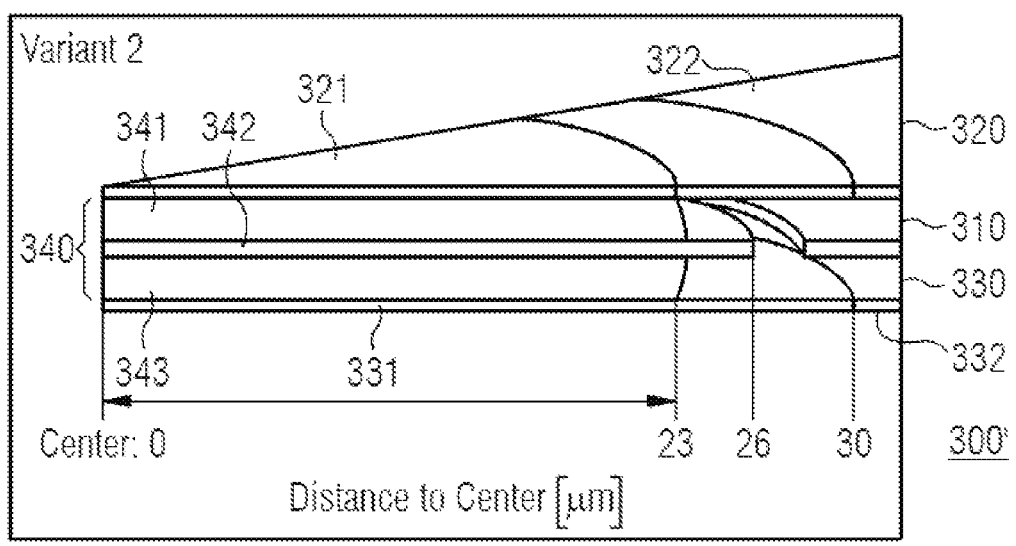
Figure 3C:
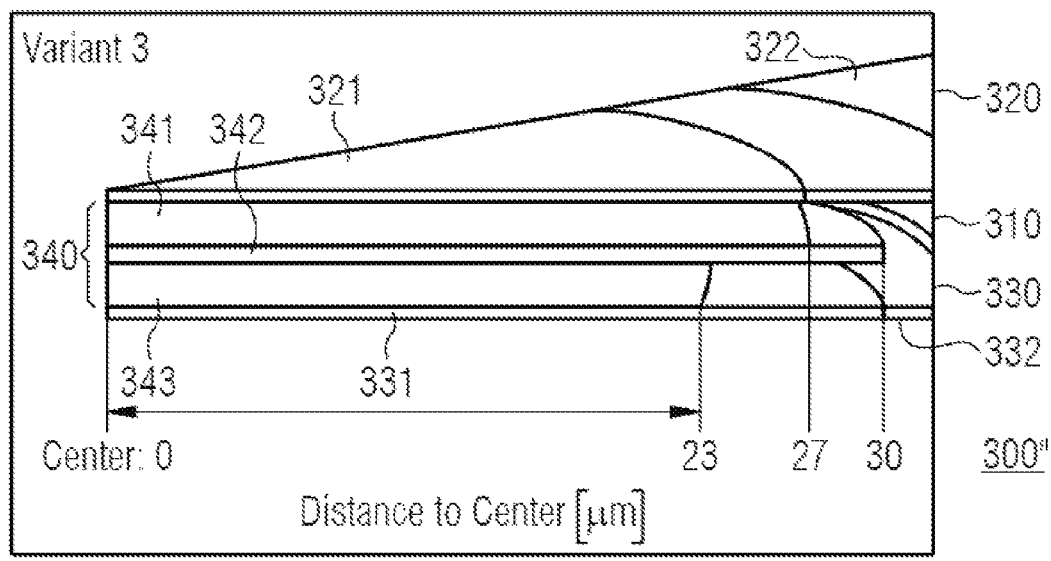

FIGS. 3a to 3c hereafter show various exemplary embodiments of vertical connection structures for connecting a first backplate structure to a second backplate structure.

FIG. 3a shows a semiconductor device 300. The semiconductor device 300 comprises a membrane structure 310 having an opening 311. Furthermore, the semiconductor device 300 comprises a first backplate structure 320, which is arranged on a first side of the membrane structure 310, and a second backplate structure 330, which is arranged on a second side of the membrane structure 310. The semiconductor device 300 furthermore comprises a vertical connection structure 340, which connects the first backplate structure 320 to the second backplate structure 330. In this case, the vertical connection structure 340 extends through the opening 311.

The first backplate structure 320 comprises a first partial region 321, in which no passages (openings) are formed, and a second partial region 322, in which passages (openings) are formed. Likewise, the second backplate structure 330 comprises a first partial region 331, in which no passages (openings) are formed, and a second partial region 332, in which passages (openings) are formed.

The vertical connection structure 340 comprises a second partial region 342 arranged vertically between a first partial region 341 and a third partial region 343. The first and third partial regions 341, 343 consist of a different material than the second partial region 342. The material of the first partial region 341 and of the third partial region 343 is e.g. an electrically insulating material (e.g. silicon oxide). The second partial region 342 consists of the same material as the membrane structure 310. A partial region of a layer structure, which partial region lies in the opening of the membrane structure 310 and is used for producing the membrane structure 310, can serve as the second partial region 342. Correspondingly, a distance between the vertical connection structure 340 (e.g. substantially a distance between the second partial region of the vertical connection structure 340) and the membrane structure 310 can be produced with great accuracy as a result of the structuring of the layer structure.

In the example shown in FIG. 3a, the lateral extension of the first partial region 341 and of the third partial region 343 is identical. The first partial region 341 and the third partial region 343 of the vertical connection structure 340 are substantially cylindrical, wherein the radius is 8 µm. The second partial region 342 is also substantially cylindrical, wherein the radius is 11 µm.

FIG. 3b shows a further semiconductor device 300'. The construction of the semiconductor device 300' is substantially identical to that of the semiconductor device 300 shown in FIG. 3a. However, the dimensions of the vertical connection structure 340 are different. In the case of the semiconductor device 300', the radius is 23 µm for the first partial region 341 and the third partial region 343 and 26 µm for the second partial region 342. The lateral extension of the vertical connection structure 340 is thus extended in the case of the semiconductor device 300' in comparison with the semiconductor device 300.

FIG. 3c thereafter shows a semiconductor device 300" in which the first partial region 341 and the third partial region 343 of the vertical connection structure 340 have different lateral extents. In the case of the semiconductor device 300", the radius is 23 µm for the first partial region 341, 27 µm for the third partial region 343 and 30 µm for the second partial region 342.

Figure 4:
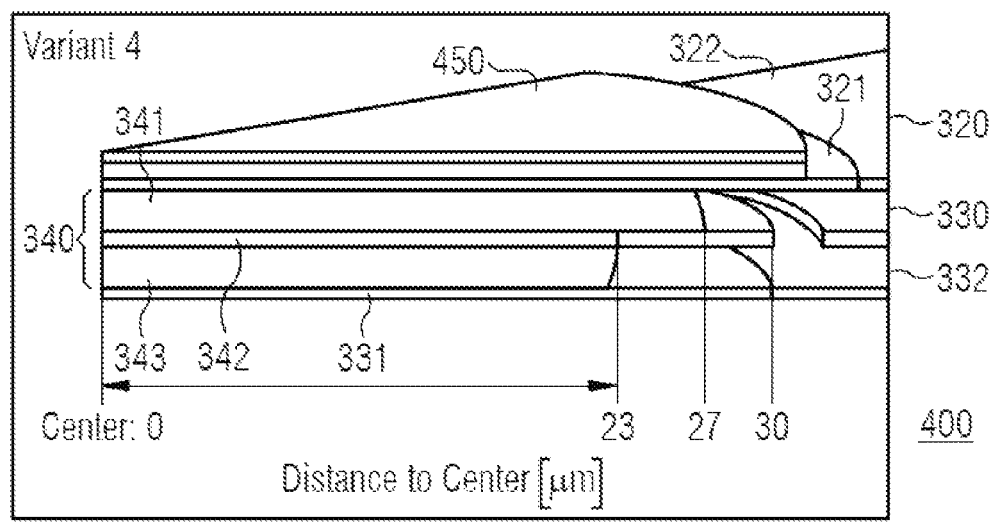
FIG. 4 shows a further exemplary embodiment of a semiconductor device.

FIG. 4 shows a further semiconductor device 400, which is substantially identical to the semiconductor device 300" shown in FIG. 3c. However, the semiconductor device 400 additionally comprises a covering layer structure 450 on the surface of the first backplate structure 320. The covering layer structure 450 is formed in a central region of the first backplate structure 320 (e.g. substantially opposite a contact region of the first backplate structure 320 with the vertical connection structure 340). The covering layer structure 450 comprises a layer composed of the same material as the first and third partial regions 341, 343 of the vertical connection structure 340, which layer is enclosed by a layer composed of the same material as the first backplate structure 320. The covering layer structure 450 can reduce a loading of the first backplate structure 320 under high (extreme) pressure loadings.

Although the covering layer structure 450 in FIG. 4 is shown in association with a vertical connection structure 340 having a variable lateral extent, it goes without saying that the covering layer structure 450 can also be used with vertical connection structures having a substantially constant lateral extent (as shown e.g. in FIGS. 3a and 3b).

FIG. 5 thereafter also shows a method 500 for producing a semiconductor device. The method 500 comprises shaping 502 a first layer structure for producing a first backplate structure. Furthermore, the method 500 comprises shaping 504 a second layer structure for producing a membrane structure having an opening. Moreover, the method 500 comprises shaping 506 a third layer structure for producing a second backplate structure. The method 500 additionally comprises removing 508 at least one part of a first sacrificial layer structure between the first backplate structure and the membrane structure and at least one part of a second sacrificial layer structure between the second backplate structure and the membrane structure, such that a vertical connection structure remains which connects the first backplate structure to the second backplate structure and extends through the opening of the membrane structure.

The method 500 can enable a mechanical connection of the first and second backplate structures as a result of the formation of the vertical connection structure. A dimensional stability of the two backplate structures can be increased as a result.

The first sacrificial layer structure and the second sacrificial layer structure can be formed e.g. from silicon oxide or graphite. By at least partly removing the sacrificial layer structures it is possible to create a cavity in which the membrane structure can move. In some exemplary embodiments, the first sacrificial layer structure and the second sacrificial layer structure therefore have, outside a region of the opening, no structures running vertically through the sacrificial layer structure. The resulting cavity can be delimited along its circumference, e.g. by a residual remainder of the sacrificial layer structures.

At least partly removing 508 the first and respectively second sacrificial layer structure can be carried out e.g. by means of a wet-chemical or dry-chemical etching method. By way of example, an isotropic wet-chemical or dry-chemical etching method can be used. In particular, the etching of the first and respectively second sacrificial layer structure can be carried out in a time-controlled manner in order to set the penetration depth of the etching or the proportion of the first and respectively second sacrificial layer structure to be removed.

Shaping 502 the first layer structure and/or shaping 506 the third layer structure can comprise forming a plurality of passages (openings) in the first backplate structure and/or the second backplate structure. That surface region of the first backplate structure and/or of the second backplate structure which is covered by passages (openings) can be increased by virtue of the vertical connection structure. An acoustic transparency of the first backplate structure and/or of the second backplate structure can be increased as a result.

Producing the membrane structure, e.g. shaping 504 for the second layer structure, can comprise structuring the membrane structure, such that at least two partial regions of the membrane structure separated from one another are formed. A first partial region of the membrane structure is laterally enclosed by a second partial region of the membrane structure. The second partial region of the membrane structure has the opening of the membrane structure, in which the first partial region is arranged.

A first of the at least two partial regions of the membrane structure separated from one another can be e.g. a partial region of the vertical connection structure (e.g. the second partial region of the vertical connection structure 140 shown in FIG. 1). This can make it possible to produce a lateral distance between the vertical connection structure (e.g. substantially the first partial region of the membrane structure) and the membrane structure (e.g. substantially the second partial region of the membrane structure) with great accuracy as a result of the structuring of the membrane structure.

In this way it is possible to produce e.g. a vertical connection structure having three partial regions. The vertical connection structure can comprise for example a second partial region arranged vertically between a first partial region and a third partial region, wherein the second partial region of the vertical connection structure is the first partial region of the membrane structure. The first and second partial regions of the vertical connection structure can be formed e.g. by residual remainders of the first and/or of the second sacrificial layer structure.

Alternatively, shaping the first sacrificial layer structure may comprise shaping a (first) partial region of the vertical connection structure, which partial region extends through the first sacrificial layer structure. The (first) partial region of the vertical connection structure comprises a different material than the first sacrificial layer structure. Furthermore, shaping the second sacrificial layer structure can comprise shaping a (third) partial region of the vertical connection structure, which partial region extends through the second sacrificial layer structure. The (third) partial region of the vertical connection structure comprises a different material than the second sacrificial layer structure. For this purpose, e.g. a part of the first and respectively second sacrificial layer structure can be etched and then filled with a different material than that of the sacrificial layer structure (e.g. with silicon or silicon nitride). In this way, the vertical connection structure can be exposed by removing the first and respectively second sacrificial layer structure around the material different than that of the sacrificial layer structure.

Figure 6A:
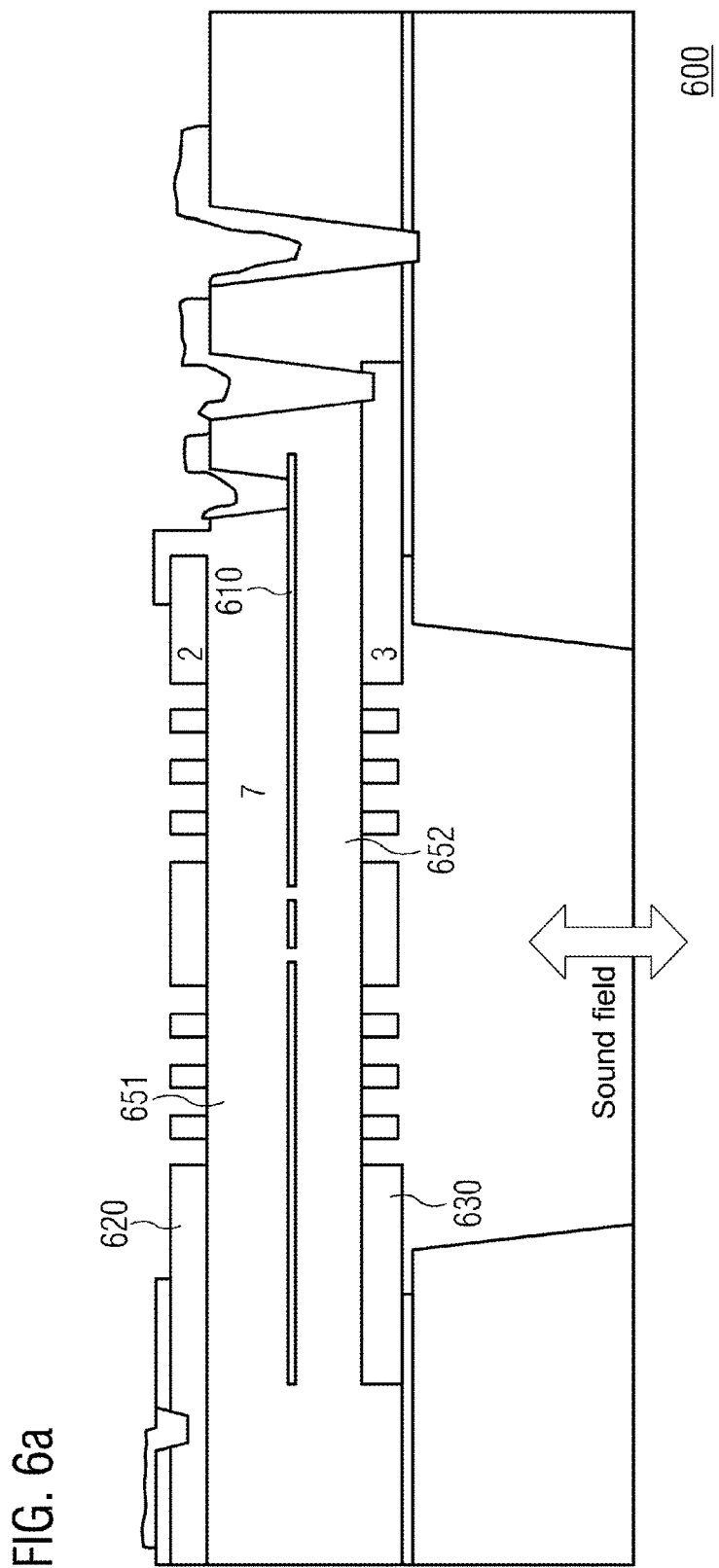

FIGS. 6a and 6b subsequently show a semiconductor structure in different method steps of a method for producing a semiconductor device in accordance with the proposed concept.

FIG. 6a firstly shows the initial situation before the process of at least partly removing the sacrificial layer structures. The semiconductor structure 600 comprises a first backplate structure (backplate) 620 and a second backplate structure (backplate) 630. A membrane structure (membrane) 610 having an opening 611 is formed between the first backplate structure 620 and the second backplate structure 630. The membrane structure is surrounded by a first sacrificial layer structure 651 and a second sacrificial layer structure 652.

In contrast to customary production of the air gap between the backplates 620, 630 and the membrane 610 by deposition of the required layer of the membranes and of the backplates and etching of the layer (sacrificial layer, e.g. silicon oxide) therebetween by means of an isotropic wet or dry etching process, the proposed concept involves e.g. using a delimited region of the sacrificial oxide etching (indicated by arrows 660), in order to produce a vertical connection structure (backplate post). This is shown in FIG. 6b. In the case of this adapted design of the backplates, a vertical connection structure (post) 640 of the sacrificial layer remains in the air gap. No additional process is required. In the case of an undercutting of the sacrificial layer structures (e.g. composed of a sacrificial oxide) of 10 μm, it is possible to leave a closed backplate ring of 30 μm e.g. a 10 μm wide post 640, in the gap.

As already indicated above, additional etching and deposition processes using different materials (e.g. silicon, silicon nitride) may also be used for implementing the post 640.

A method in accordance with the proposed concept makes it possible to create semiconductor devices and respectively microphones having an improved acoustic performance. The essence of the invention may involve producing (using) one or more posts between the backplates of e.g. a silicon microphone comprising a double backplate, in order to improve the stiffness and to allow a higher acoustic transparency of the backplates with a reduced noise contribution. The increase in the SNR may be a significant aspect for silicon microphones. As mentioned above, an advantage in the performance may also be used for a cost reduction on account of a chip size reduction with a similar acoustic system performance.

The features disclosed in the description above, the following claims and the accompanying figures may be of importance and implemented both individually and in arbitrary combination for the realization of an exemplary embodiment in the various configurations thereof.

Although some aspects have been described in association with a device, it goes without saying that these aspects also constitute a description of the corresponding method, and so a block or a component of a device should also be understood as a corresponding method step or as a feature of a method step. Analogously thereto, aspects that have been described in association with or as a method step also constitute a description of a corresponding block or detail or feature of a corresponding device.

The exemplary embodiments described above merely constitute an illustration of the principles of the present invention. It goes without saying that modifications and variations of the arrangements and details described herein will become apparent to others skilled in the art. Therefore, the intention is that the invention shall be restricted only by the scope of protection of the following patent claims and not by the specific details that have been presented on the basis of the description and the explanation of the exemplary embodiments herein.

The invention claimed is:

1. A semiconductor device comprising:
   a membrane structure having an opening;
   a first backplate structure arranged on a first side of the membrane structure;
   a second backplate structure arranged on a second side of the membrane structure; and
   a vertical connection structure connecting the first backplate structure to the second backplate structure,
   wherein the vertical connection structure extends through the opening,
   wherein the vertical connection structure comprises a second partial region arranged vertically between a first partial region and a third partial region, and
   wherein a material of the second partial region is different than a material of the first partial region and of the third partial region.

2. The semiconductor device according to Claim 1, wherein the material of the first partial region and of the third partial region is an electrically insulating material.

3. The semiconductor device according to claim 1, wherein the vertical connection structure and the membrane structure are spaced apart from one another by at least 100 nm laterally in a region of the opening.

4. The semiconductor device according to claim 1, wherein an average circumference of the vertical connection structure in a region between the first backplate structure and the membrane structure differs by at least 10% from an average circumference of the vertical connection structure in a region between the membrane structure and the second backplate structure.

5. The semiconductor device according to claim 1, wherein at least one of the first backplate structure and the second backplate structure has a plurality of passages.

6. The semiconductor device according to claim 5, wherein the plurality of passages takes up at least 60% of a surface area of at least one of the first backplate structure and the second backplate structure.

7. The semiconductor device according to claim 1, wherein the membrane structure is arranged in a cavity between the first backplate structure and the second backplate structure.

8. The semiconductor device according to claim 1, wherein a lateral distance between the vertical connection structure and an edge of the membrane structure is at least 25% of a lateral extension of the membrane structure.

9. The semiconductor device according to claim 1, wherein a lateral distance between the opening and an edge of the membrane structure is at least 5 μm.

10. The semiconductor device according to claim 1, furthermore comprising a first circuit, which is configured to apply different electrical potentials to the membrane structure and at least one of the first backplate structure and the second backplate structure.

11. The semiconductor device according to claim 1, furthermore comprising a second circuit, which is configured to generate a signal dependent on the distance between the membrane structure and the first backplate structure or the second backplate structure.

12. The semiconductor device of claim 1, wherein the semiconductor device is a microphone.

13. A method for producing a semiconductor device, the method comprising:
   shaping a first layer structure for producing a first backplate structure;
   shaping a second layer structure for producing a membrane structure having an opening;
   shaping a third layer structure for producing a second backplate structure; and
   removing at least one part of a first sacrificial layer structure between the first backplate structure and the membrane structure and at least one part of a second sacrificial layer structure between the second backplate structure and the membrane structure, such that a vertical connection structure remains which connects the first backplate structure to the second backplate structure and extends through the opening of the membrane structure,
   wherein removing the at least one part of the first sacrificial layer structure comprises forming a first partial region of the vertical connection structure,
   wherein removing the at least one part of the second sacrificial layer structure comprises forming a third partial region of the vertical connection structure,
   wherein the vertical connection structure comprises a second partial region arranged vertically between a first partial region and a third partial region, and
   wherein a material of the second partial region is different than a material of the first partial region and of the third partial region.

14. The method according to claim 13, wherein producing the membrane structure comprises structuring the membrane structure, such that at least two partial regions of the membrane structure separated from one another are formed.

15. The method according to claim 14, wherein a first of the at least two partial regions of the membrane structure separated from one another is the second partial region of the vertical connection structure.

16. The method according to claim 13,
   wherein removing the at least one part of the first sacrificial layer structure comprises shaping the first partial region of the vertical connection structure which extends through the first sacrificial layer structure, and
   wherein the first partial region of the vertical connection structure comprises a different material than the first sacrificial layer structure.

17. The method according to claim 13,
   wherein removing the at least one part of the second sacrificial layer structure comprises shaping the second partial region of the vertical connection structure which extends through the second sacrificial layer structure, and
   wherein the second partial region of the vertical connection structure comprises a different material than the second sacrificial layer structure.

18. The method according to claim 13, wherein the first sacrificial layer structure and the second sacrificial layer structure have no structures running vertically through the sacrificial layer structure.

19. The method according to claim 13, wherein shaping the first layer structure and shaping the third layer structure comprise forming a plurality of passages in the first backplate structure and the second backplate structure.

20. The semiconductor device according to claim 1, wherein the second partial region and the membrane structure comprise a same material.

* * * * *